United States Patent
Brankner et al.

(10) Patent No.: US 6,465,339 B2
(45) Date of Patent: Oct. 15, 2002

(54) TECHNIQUE FOR INTRALEVEL CAPACITIVE ISOLATION OF INTERCONNECT PATHS

(75) Inventors: Keith Brankner, Richardson, TX (US); Kenneth D. Brennan, Boise, ID (US); Yvette Shaw, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/216,240

(22) Filed: Dec. 18, 1998

(65) Prior Publication Data

US 2002/0048933 A1 Apr. 25, 2002

Related U.S. Application Data

(60) Provisional application No. 60/068,191, filed on Dec. 19, 1997.

(51) Int. Cl.[7] ....................... H01L 21/44; H01L 21/4763
(52) U.S. Cl. ................. 438/622; 438/626; 438/631; 438/633
(58) Field of Search ............... 438/622, 625, 438/637, 627, 629, 631, 633, 626

(56) References Cited

U.S. PATENT DOCUMENTS

| | | | |
|---|---|---|---|
| 5,164,334 A | * 11/1992 | Mizushima | 438/629 |
| 5,391,921 A | 2/1995 | Kudoh | |
| 5,407,860 A | * 4/1995 | Stoltz et al. | |
| 5,625,232 A | * 4/1997 | Numata et al. | 257/758 |
| 5,668,398 A | 9/1997 | Havemann | |
| 5,741,741 A | * 4/1998 | Tseng | 438/637 |
| 5,750,415 A | * 5/1998 | Gnade et al. | |
| 5,798,559 A | 8/1998 | Bothra et al. | |
| 5,827,782 A | * 10/1998 | Shih | 438/697 |
| 5,861,653 A | * 1/1999 | Ada | 257/386 |
| 5,863,832 A | * 1/1999 | Doyle et al. | 438/622 |
| 5,869,880 A | * 2/1999 | Grill et al. | 257/522 |
| 5,880,018 A | * 3/1999 | Boeck et al. | 438/619 |
| 5,880,026 A | * 3/1999 | Xing et al. | 438/688 |
| 5,908,318 A | 6/1999 | Wang et al. | |
| 5,960,310 A | * 9/1999 | Jeong | 438/622 |
| 5,985,747 A | * 11/1999 | Taguchi | 438/632 |
| 5,994,776 A | * 11/1999 | Fang et al. | 257/758 |
| 6,077,770 A | * 6/2000 | Hsu | 438/622 |
| 6,146,985 A | * 11/2000 | Wollesen | 438/618 |

FOREIGN PATENT DOCUMENTS

| | | | |
|---|---|---|---|
| DE | 44 41 898 C1 | 7/1991 | |
| JP | 11-330232 | * 11/1999 | H01L/21/768 |

* cited by examiner

Primary Examiner—Mary Wilczewski
(74) Attorney, Agent, or Firm—W. James Brady; Frederick J. Telecky, Jr.

(57) ABSTRACT

A technique is described for providing cavities between the conducting paths of an integrated semiconductor circuit. These cavities can have air or a gas trapped therein to decrease the dielectric constant between two conducting paths. After forming the conducting paths, an etchable fill material formed between and over the conducting paths. An oxide cap is formed over the fill material. Conducting plugs, extending through the fill material and the oxide cap, and electrically coupled to the conducting paths are formed. A photo-resist layer applied over the conducting plugs and the oxide cap. The photo-resist layer is structured to permit access to the oxide cap between the conducting plugs. A "pin-hole" is fabricated through the oxide cap and the fill material exposed by the "pin-hole" is etched away. The "pin-hole" is plugged with additional oxide cap material and a surface is then formed on the oxide cap exposing the conducting plugs. This structure is then ready for additional processing.

9 Claims, 3 Drawing Sheets

TECHNIQUE FOR INTRALEVEL CAPACITIVE ISOLATION OF INTERCONNECT PATHS

This application claims priority under 35 USC §119 (e)(1) of provisional application No. 60/068,191, filed Dec. 19, 1997.

BACKGROUND OF THE INVENTION

1. Field of the Invention

This invention relates to generally to integrated circuits and, more particularly, to the conducting metal strips that electrically interconnect the components in the circuit. Typically, these metal strips are arranged in layers, typically called metal layers. An integrated circuit may have a plurality of metal layers.

2. Description of the Related Art

As the scale of integrated circuits has decreased, the distance between conducting strips electrically coupling components in the integrated circuit has necessarily decreased. The decreased spacing between conducting paths has increased the cross-talk between the conducting paths and has increased the capacitance. The increased cross-talk provides for a possible compromise of the integrity of the signals transmitted on the conducting path and the increased capacitance has compromised the speed with which signals can be transmitted over the conducting path. In the past, attempts have been made to decrease the dielectric constant between the conducting paths. A decrease in the dielectric constant results in both decreased cross-talk and decreased capacitance, thereby increasing the performance of the integrated circuit. However, the decrease the dielectric constant with materials compatible with integrated circuit technology, while improving the performance of the integrated circuits, never-the-less further improvement of the performance of integrated circuit is required.

A need has therefore been felt for a technique to decrease the dielectric constant of the material between the conducting strips of a metal layer.

SUMMARY OF THE INVENTION

The aforementioned and other features are accomplished, according to the present invention, by introducing a gas (typically air) into the region between the conducting strips of a metal layer, the gas having a lower dielectric constant than materials compatible with the processes for manufacturing integrated circuits. After formation of conducting strips of the metal layer material, a thin protective dielectric film is placed over the metal layer material and the exposed dielectric material upon which the metal layer conducting strips are formed. A fill layer material and an oxide cap material are formed over the remaining metal layer material and the exposed dielectric layer. The vias are formed in the fill material and the oxide cap material.

These and other features of the present invention will be understood upon the reading of the following description in conjunction with the Figures.

DESCRIPTION OF THE PREFERRED EMBODIMENT(S)

1. Detailed Description of the Drawings

Figure 1A:
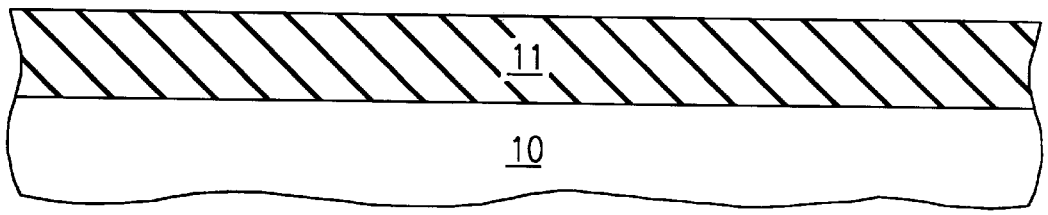
FIG. 1A through FIG. 1I illustrate the technique for providing an air gap between conductors in an integrated circuit according to the present invention.
Figure 1B:
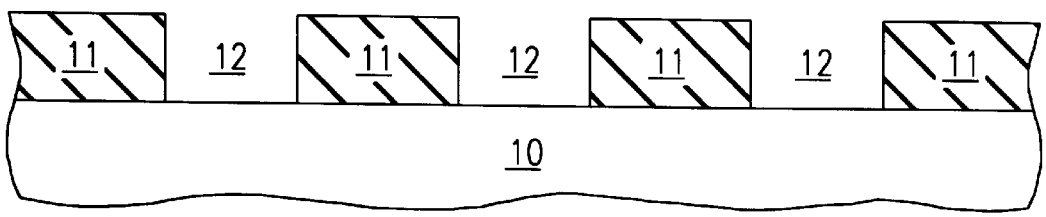
Figure 1C:
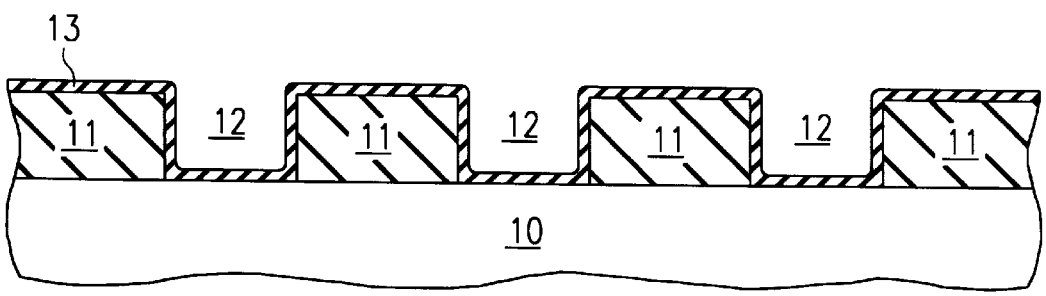
Figure 1D:
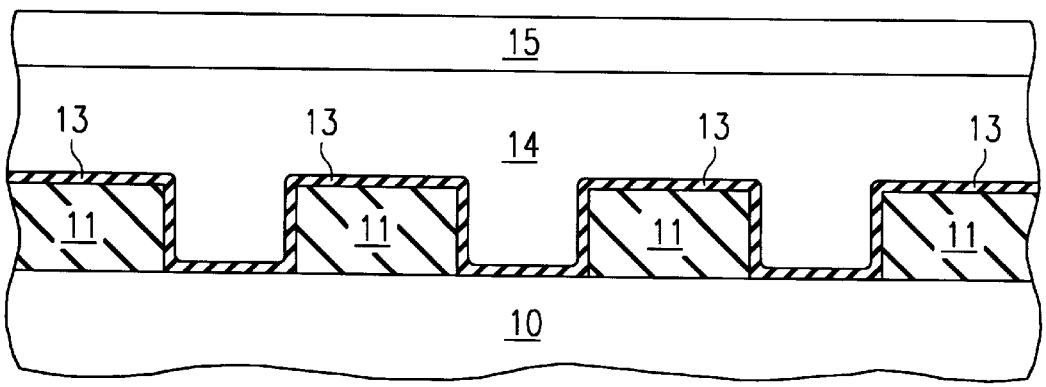
Figure 1E:
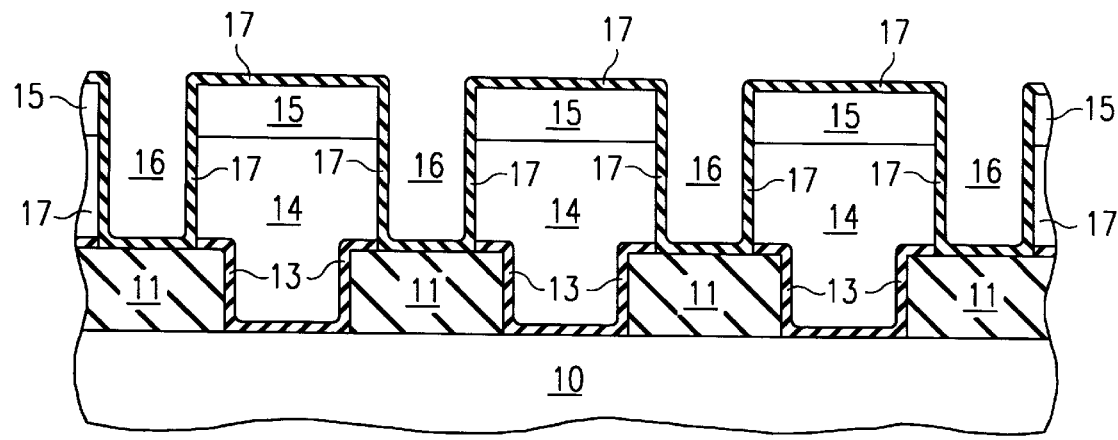
Figure 1F:
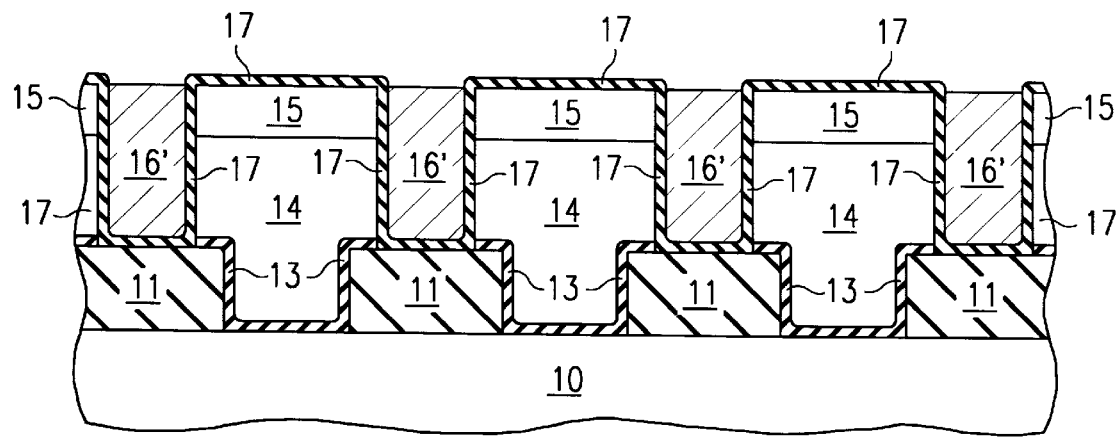
Figure 1G:
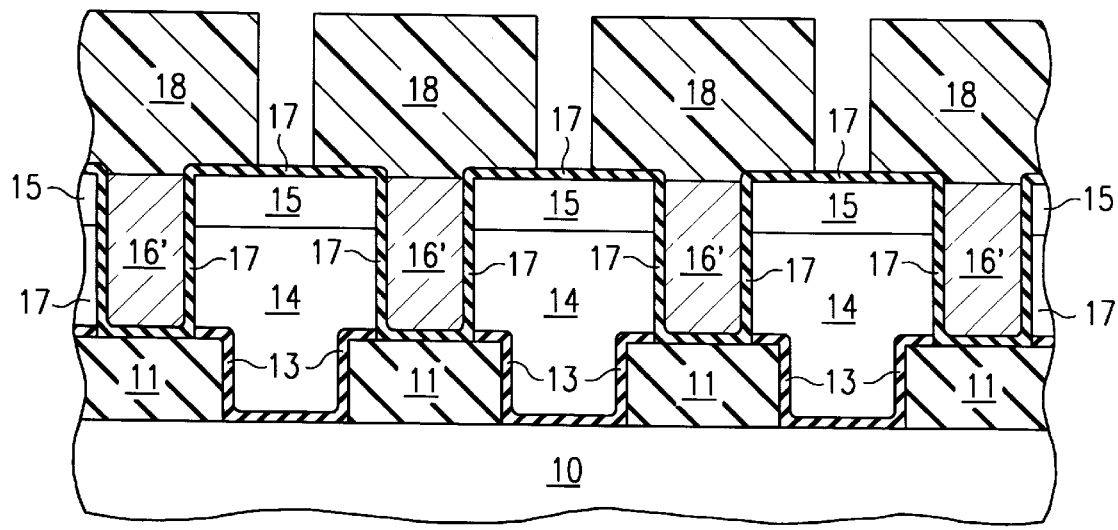
Figure 1H:
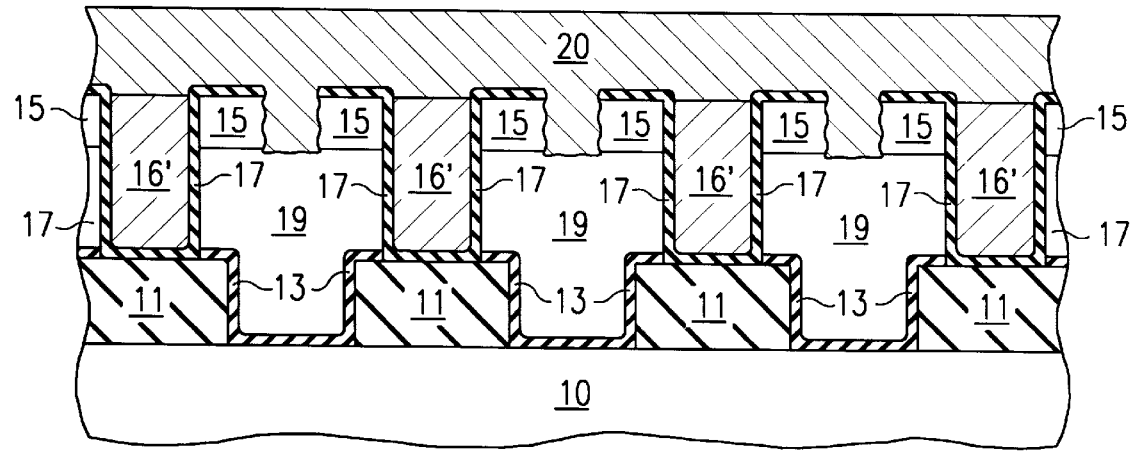
Figure 1I:
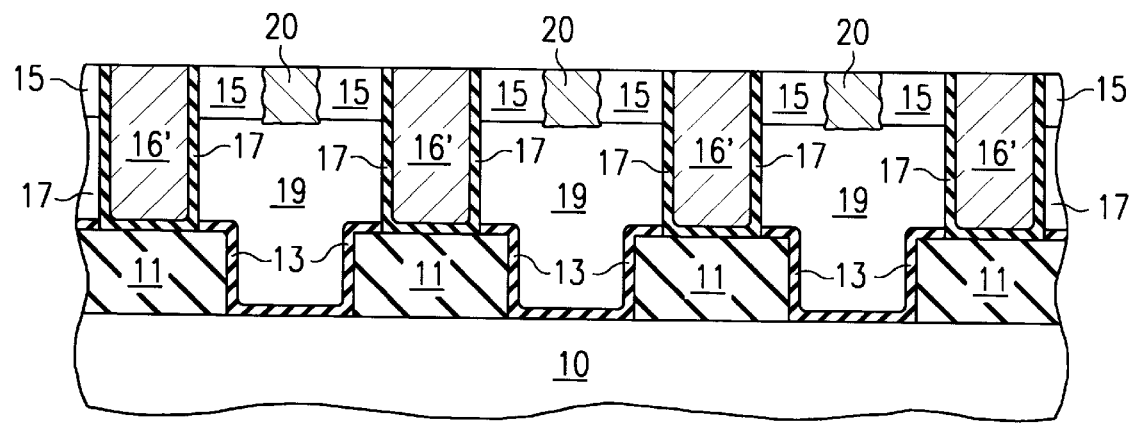

FIGS. 1A–1I illustrate the technique for providing an air-gap between conducting paths of an integrated semiconductor circuit. Referring now to FIG. 1A, a conducting layer (i.e., a metal-n layer) 11 is formed on a poly-metal dielectric layer 10. In FIG. 1B, the conducting material layer has been etched to provide the conducting paths (or interconnect paths) 11 separated by air gaps 12. A thin (~300 Å) layer of a dielectric film (e.g., an oxide material) 13 is deposited over the exposed portions of the conducting paths 11 and the poly-metal dielectric 10 in FIG. 1C. In FIG. 1D, instead of the usual inter-level dielectric material, a fill material 14, selected so as to be removed using for example a $Cl_2$ isotropic etch, is applied to conducting material pattern. An oxide-cap material 15 is applied over the fill material 14. In FIG. 1E, vias 16 are etched through the oxide cap material 15, the fill material 14, and dielectric film 13. A (titanium nitride/titanium) plug liner 17 is applied to the exposed surfaces, contacting conducting paths 11. In FIG. 1F, the vias 16 are filled with a conducting plug material (for example tungsten) to become the conducting plugs 16'. Referring to FIG. 1G, a photo resist layer 18 is formed over the oxide. layer 17 and the exposed plugs 16'. The photo resist layer 18 is then patterned to protect the conducting plugs 16' and permits "pin-holes" to be etched in the plug liner 17 and oxide cap material to expose the fill material 14. In FIG. 1H, large areas of the fill material 14 are etched away creating cavities 19. The photo resist material 18 is then stripped and the "pin-holes" in the oxide cap are plugged with additional oxide material 20, as shown in FIG. 1H. In FIG. 1I, the oxide material 20 and the oxide cap 15 are subjected to chemical/mechanical processing to expose the conducting plugs 16'. The integrated circuit is then ready for additional processing.

2. Operation of the Preferred Embodiment(s)

The procedure described above provides a technique for providing a substantial amount of gas (e.g., air) in the space between conducting paths and, particularly, between the parallel conducting paths of an interconnect layer. As a result of the gas between the conducting paths, the dielectric constant is lowered, thereby resulting in less parasitic capacitance and reduced cross-talk between the signal currents carried by the conducting paths. "Dummy" conducting paths and/or "dummy" conducting plugs can be added to provide additional support structures or to provide for more efficient thermal conduction.

While the invention has been described with particular reference to the preferred embodiment, it will be under stood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from he foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. The method of fabricating a conducting layer in an integrated circuit, said conducting layer including at least two conducting paths, said method comprising the steps of:

forming said conducting paths;

forming a layer of etchable material between and over said conducting paths;

forming a removable fill material over and between said conducting paths;

forming an oxide layer over said fill material;

forming vias through the etchable material, the fill material, and the oxide layer;

filling the vias with a conductive material to form conducting plugs in electrical contact with said conducting paths;

forming an aperture in said oxide layer at a location between first and second ones of the conducting plugs to provide an entrance to said removable fill material;

removing at least a portion of said fill material under the oxide layer and extending away from the location of the aperture, so that at least a portion of the fill material disposed over one of the conducting paths is removed; and depositing a second oxide layer over said conducting plugs and said oxide layer.

2. The method of claim 1 wherein said removable fill material is an etchable material.

3. The method of claim 2, wherein the step of removing at least a portion of said fill material comprises:

etching the fill material through the apertures.

4. The method of claim 1 further comprising a step of:

chemical/mechanical processing the second oxide layer to expose said conducting plugs.

5. The method of claim 1, further comprising:

creating dummy vias through at least the fill material and oxide layer; and filling the dummy vias with conductive material to form dummy conductive plugs for mechanical support of said oxide layer.

6. The method of claim 1, wherein the step of forming an aperture is performed by a photoresist process.

7. The method of claim 1, further comprising:

after the step of forming vias, forming a liner layer;

wherein the step of filling the vias fills the vias with conductive material over the liner layer.

8. The method of claim 1, wherein the step of depositing a second oxide layer forms enclosed cavities that are filled with a gas.

9. The method of claim 8 wherein said gas is air.

* * * * *